(12) United States Patent
Chi et al.

(10) Patent No.: US 7,303,957 B2
(45) Date of Patent: Dec. 4, 2007

(54) METHOD OF FABRICATING A FLASH MEMORY DEVICE

(75) Inventors: Kyeong-koo Chi, Seoul (KR); Seung-pil Chung, Seoul (KR); Chang-jin Kang, Seongnam-si (KR); Jai-hyuk Song, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/517,254

(22) Filed: Sep. 8, 2006

(65) Prior Publication Data
US 2007/0059876 A1    Mar. 15, 2007

(30) Foreign Application Priority Data
Sep. 8, 2005    (KR) .................. 10-2005-0083649

(51) Int. Cl.
*H01L 21/336*    (2006.01)
(52) U.S. Cl. ............... 438/257; 438/259; 257/E21.179; 257/E21.68
(58) Field of Classification Search ............... 438/257, 438/259; 257/E21.179, E21.662, E21.68
See application file for complete search history.

(56) References Cited

U.S. PATENT DOCUMENTS

| 6,849,519 B2 | 2/2005 | Dong | |
| 7,037,785 B2 * | 5/2006 | Dong et al. | 438/259 |
| 7,115,940 B2 * | 10/2006 | Sumino et al. | 257/315 |
| 7,151,043 B2 * | 12/2006 | Kim et al. | 438/435 |
| 2004/0072408 A1 | 4/2004 | Yun et al. | |

FOREIGN PATENT DOCUMENTS

JP    11-176962    7/1999

\* cited by examiner

*Primary Examiner*—Trung Dang
(74) *Attorney, Agent, or Firm*—Volentine & Whitt, PLLC

(57) ABSTRACT

A method of fabricating a flash memory device using a process for forming a self-aligned floating gate is provided. The method comprises forming mask patterns on a substrate, etching the substrate using the mask patterns as an etch mask to form a plurality of trenches, and filling the trenches with a first insulating layer, wherein sidewalls of the mask patterns remain exposed after filling the trenches with the first insulating layer. The method further comprises forming spacers on the exposed sidewalls of the mask patterns, filling upper insulating spaces with a second insulating layer thereby defining isolation layers, and removing the mask patterns and the spacers.

19 Claims, 6 Drawing Sheets

METHOD OF FABRICATING A FLASH MEMORY DEVICE

This application claims priority to Korean Patent Application No. 10-2005-0083649, filed on Sep. 8, 2005, the subject matter of which is hereby incorporated by reference in its entirety.

BACKGROUND OF THE INVENTION

1. Field of the Invention

Embodiments of the invention relate to a method of fabricating a flash memory device, and more particularly, to a method of fabricating a flash memory device using a process for forming a self-aligned floating gate.

2. Description of the Related Art

Flash memory is nonvolatile, generally has excellent data integrity, and can have high integration density like dynamic random access memory (DRAM). Because flash memory has the characteristics described above, it may be used, for example, for the main memory in a computer system. Additionally, flash memory is a suitable replacement for hard disks and floppy disks because flash memory generally has high integration density and large storage capacity.

A cell transistor in a flash memory device is generally a stacked gate transistor comprising a gate structure in which a tunnel oxide layer, a floating gate, an inter-gate insulating layer, and a control gate are stacked. The program operation for a flash memory device comprising the stacked gate structure described above generally involves the application of a positive voltage to the control gate. During the program operation, the positive voltage that is applied to the control gate is coupled with the floating gate and electrons in a substrate are then captured in the floating gate when electrons move from the substrate through the tunnel oxide layer and into the floating gate through Fowler-Nordheim tunneling and hot carrier injection. A relatively high coupling ratio between the control gate and the floating gate is required in order to apply a relatively strong electric field to the tunnel oxide layer while applying a relatively low input voltage to the control gate. The coupling ratio, as used herein, is a ratio of the voltage induced at the floating gate to the voltage applied to the control gate. The coupling ratio is also represented as a ratio of the capacitance of the inter-gate insulating layer to the total capacitance of the tunnel oxide layer and the inter-gate insulating layer.

Figure (FIG.) 1 is a schematic cross-sectional view of a cell transistor of a conventional flash memory device.

Referring to FIG. 1, an isolation layer 2 is formed in a substrate 1 to define active regions. A floating gate 4 is formed on an active region, and a tunnel oxide layer 3 interposed between floating gate 4 and substrate 1. A control gate 7 is formed on floating gate 4, and an inter-gate insulating layer 6 is interposed between control gate 7 and floating gate 4.

In the flash memory device of FIG. 1, the coupling ratio is affected by the surface area of the portion of inter-gate insulating layer 6 that is formed on an upper surface and both sidewalls of floating gate 4. Accordingly, the size of floating gate 4 must be increased in order to increase the surface area of the portion of inter-gate insulating layer 6 formed on floating gate 4 to thereby increase the coupling ratio of the flash memory device of FIG. 1.

As the critical dimensions (e.g., line width) of flash memory devices decrease, properly aligning floating gate 4 with the active region when forming floating gate 4 becomes particularly important. In a method for manufacturing a cell transistor of the flash memory device illustrated in FIG. 1, isolation layer 2 is formed in substrate 1 to define active regions of substrate 1. Thereafter, a polysilicon layer is deposited on the entire surface of substrate 1, and the polysilicon layer is then patterned to form floating gate 4 on an active region of substrate 1. However, as the critical dimensions for the active region and floating gate 4 decrease, the active region and floating gate 4 are often misaligned when floating gate 4 is formed through a photolithography process. This misalignment degrades the distribution of an erase threshold voltage Vth.

A method for forming a self-aligned floating gate, which is illustrated in FIGS. 2 through 5, has been proposed in response to the misalignment problem described above.

Referring to FIG. 2, mask patterns 15 for defining active regions of substrate 10 are formed on substrate 10 and trenches 25 are formed in substrate 10 using mask patterns 15. Thereafter, an insulating layer is deposited to fill trenches 25 and the spaces between mask patterns 15. The insulating layer is then planarized to form isolation layers 30. Referring to FIG. 3, mask patterns 15 are then removed and, as a result, upper portions of isolation layers 30 protrude from a surface of substrate 10 and define holes H. Holes H are formed in the areas from which mask patterns 15 have been removed, and floating gates will subsequently be formed in holes H. Referring to FIG. 4, sidewalls of isolation layers 30 are etched (i.e., pulled back) through wet etching process to expand the width of each hole H. When sidewalls of isolation layers 30 are etched, the resulting surface area of the floating gates to be formed in holes H, and thus the coupling ratio of the flash memory device, increases relative to the floating gates formed when the sidewalls of isolation layers 30 are not etched. Referring to FIG. 5, a tunnel oxide layer 35 is then formed on substrate 10 between adjacent isolation layers 30, and polysilicon is then deposited on tunnel oxide layer 35 to fill holes H. Thereafter, a planarization process is performed using chemical mechanical polishing (CMP) to form self-aligned floating gates 40 disposed between adjacent isolation layers 30. Then, although it is not illustrated in FIG. 5, isolation layers 30 disposed between self-aligned floating gates 40 are etched (i.e., recessed) through a wet etchback process to expose the sidewalls of self-aligned floating gates 40, thereby increasing the surface area of the portion an inter-gate insulating layer that will be formed on the upper surface and the sidewalls of each self-aligned floating gate 40.

The conventional method described above makes it possible to form a floating gate while substantially preventing misalignment between the floating gate and the active region and efficiently using the area of the active region. However, when the design rule for the flash memory device is reduced to 60 nm to reduce a distance between adjacent cells to 40 nm or less, trenches 25 will not be completely filled with the insulating layer and thus a void V is formed and remains in an isolation layer 30, as illustrated in FIG. 2. Additionally, during the formation of the floating gate, void V is filled with the material used to form the floating gate, so void V will cause an electrical short.

Alternatively, as illustrated in FIG. 6, trenches 25 are filled with an undoped silicate glass (USG) oxide layer 30, which has an excellent inter-layer filling characteristic(s), and then USG oxide layer 30, in which a void is formed, is etched to remove the void from the isolation layer. Thereafter, a hard oxide layer 32, which is harder than USG oxide layer 30, is formed on USG oxide layer 30 in the spaces between mask patterns 15. During the subsequent CMP process, hard oxide layer 32, which is well-suited for isolating nodes (i.e., conducive to node isolation), acts as a planarization stop layer.

Even when double oxide layers 30, 32 (i.e., USG oxide layers 30 and hard oxide layers 32) are formed, it is still necessary to remove mask patterns 15 and reduce the width of (i.e., pull back) isolation layers 30, 32 (i.e., double oxide layers 30, 32) to expand the holes in which floating gates will subsequently be formed, as illustrated in FIGS. 7 and 8.

However, when using isolation layers 30, 32 it is difficult to reduce the widths of isolation layers 30, 32 through a wet etching process because hard oxide layers 32 are relatively highly cohesive to USG layers 30 and have relatively low reactivity to wet chemical etchant; and thus, isolation layers 30, 32 are difficult to etch through a wet etching process. Also, when isolation layers 30, 32 are etched too much (i.e., over-etched) it is difficult to obtain uniformity among the structures formed on a wafer.

In relatively extreme circumstances, etching isolation layers 30, 32 too much may generate a pit P where an active region of substrate 10 and an isolation layer 30, 32 (i.e., USG oxide layer 30) generally meet, as illustrated in FIG. 8. When the wet etching process is not performed in a way that substantially prevents the creation of a pit P, it is difficult to form a flash memory device, using isolation layers 30, 32, that both operates reliably and has an increased coupling ratio relative to when isolation layers 30, 32 are not etched to increase the width of a hole in which a floating gate will be formed.

SUMMARY OF THE INVENTION

Embodiments of the invention provide a method of fabricating a flash memory device through which the void in an insulating layer is substantially eliminated and holes that are wider than previously formed mask patterns are formed.

In one embodiment, the invention provides a method of fabricating a flash memory device comprising forming mask patterns on a substrate, etching the substrate using the mask patterns as an etch mask to form a plurality of trenches, and filling the trenches with a first insulating layer, wherein sidewalls of the mask patterns remain exposed after filling the trenches with the first insulating layer. The method further comprises forming spacers on the exposed sidewalls of the mask patterns, filling upper insulating spaces with a second insulating layer thereby defining isolation layers, and removing the mask patterns and the spacers.

BRIEF DESCRIPTION OF THE DRAWINGS

Embodiments of the invention will be described herein with reference to the accompanying drawings, in which like reference symbols indicate like or similar elements. In the drawings.

DESCRIPTION OF EMBODIMENTS

Figure 1:
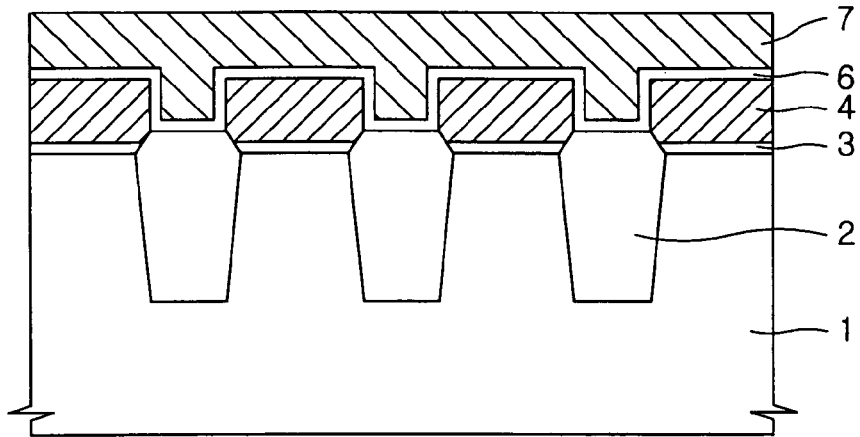
FIG. 1 is a schematic cross-sectional view of a cell transistor of a conventional flash memory device.
Figure 2:
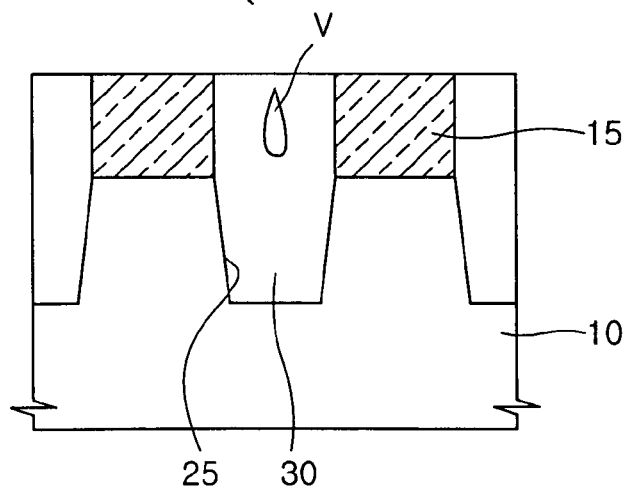
FIGS. 2 through 5 are cross-sectional views illustrating a conventional method for fabricating a flash memory device comprising a self-aligned floating gate.
Figure 3:
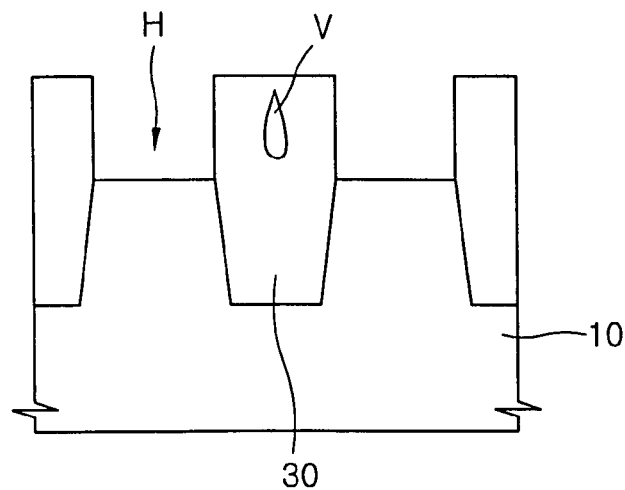
Figure 4:
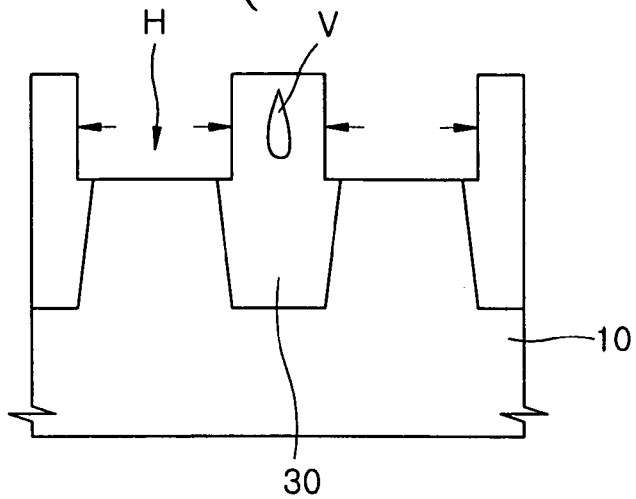
Figure 5:
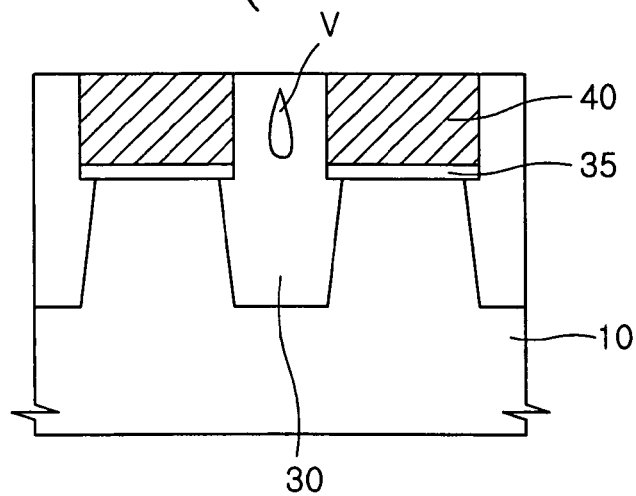
Figure 6:
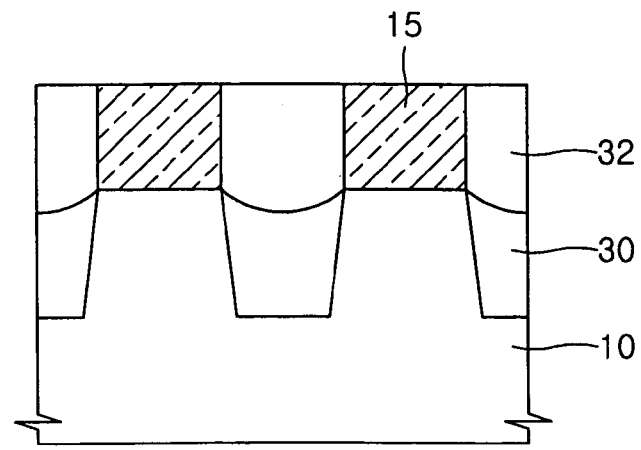
FIGS. 6 through 8 are cross-sectional views illustrating another conventional method for fabricating a flash memory device.
Figure 7:
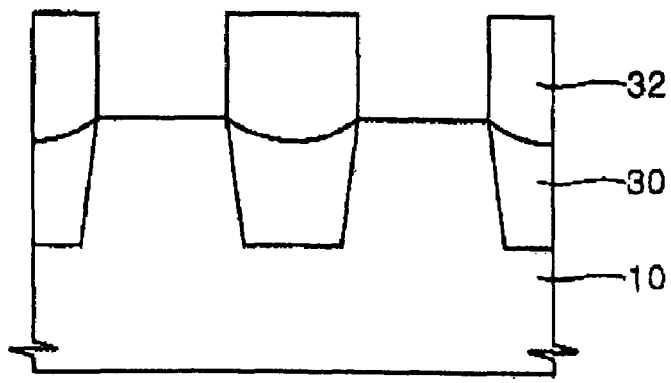
Figure 8:
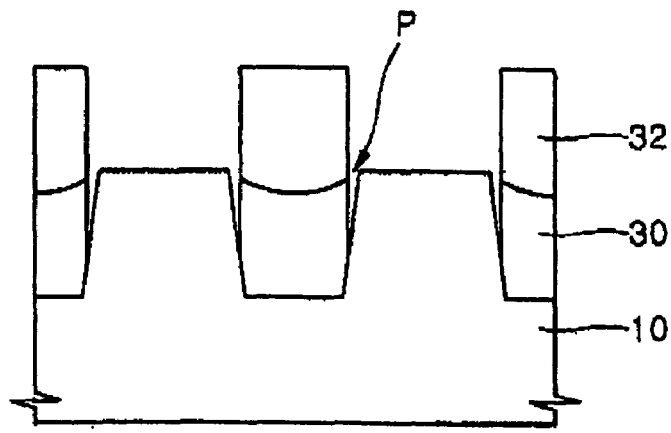

In the drawings, the thicknesses of layers and regions are exaggerated for clarity. As used herein, when a first element or layer is said to be "on" a second element or layer, the first element may be directly on the second element or intervening elements or layers may be present.

FIGS. 9 through 16 are cross-sectional views illustrating a method of fabricating a flash memory device in accordance with an embodiment of the invention.

Figure 9:
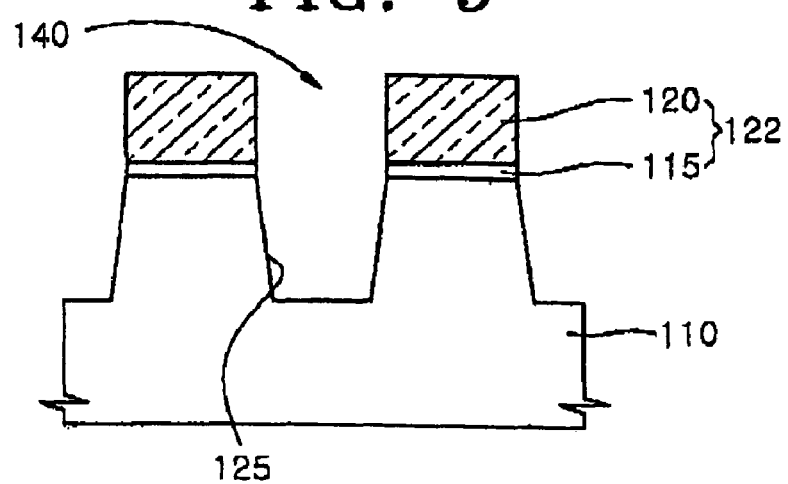
FIGS. 9 through 16 are cross-sectional views illustrating a method for fabricating a flash memory device in accordance with an embodiment of the invention; and, FIG. 17 is a cross-sectional view illustrating an intermediate stage in a method for fabricating a flash memory device in accordance with another embodiment of the invention.

Referring to FIG. 9, a semiconductor substrate 110 (hereafter, substrate 110), such as a silicon (Si) substrate, is prepared. Next, a pad oxide layer 115 and a pad nitride layer 120 are formed (i.e., stacked) on substrate 110, and portions of pad oxide layer 115 and pad nitride layer 120 are patterned to form mask patterns 122, which define active regions of substrate 110. Pad oxide layer 115 may be formed through dry oxidation using $O_2$ gas or through wet oxidation using $H_2O$ in order to suppress crystal defects on a surface of substrate 110 or to perform a surface-treatment process on the surface of substrate 110. As an example, pad oxide layer 115 may be formed with a thickness of 50-250 Å at a temperature of 700-950° C. Pad oxide layer 115 may be formed using furnace-type equipment or chamber-type equipment. Before or after the formation of pad oxide layer 115, ions may be implanted into substrate 110 to form a well or a Vt adjusting layer. Pad nitride layer 120 may be formed by depositing silicon nitride using low pressure chemical vapor deposition (LPCVD). An isolation layer will be formed subsequently such that it protrudes to a certain height above the surface of substrate 110, and the thickness of pad nitride layer 120 is determined in accordance with the desired height for the protrusion of the isolation layer. For example, pad nitride layer 120 may be formed with a thickness of about 2000-3000 Å. Thereafter, substrate 110 is etched using patterned pad oxide layer 115 and patterned pad nitride layer 120 (i.e., mask patterns 122) as an etch mask, thereby forming trenches 125 in substrate 110, and thus forming insulating regions 140 as well. Each insulating region 140 comprises a first trench 125 and the space disposed above first trench 125 and between adjacent mask patterns.

Figure 10:
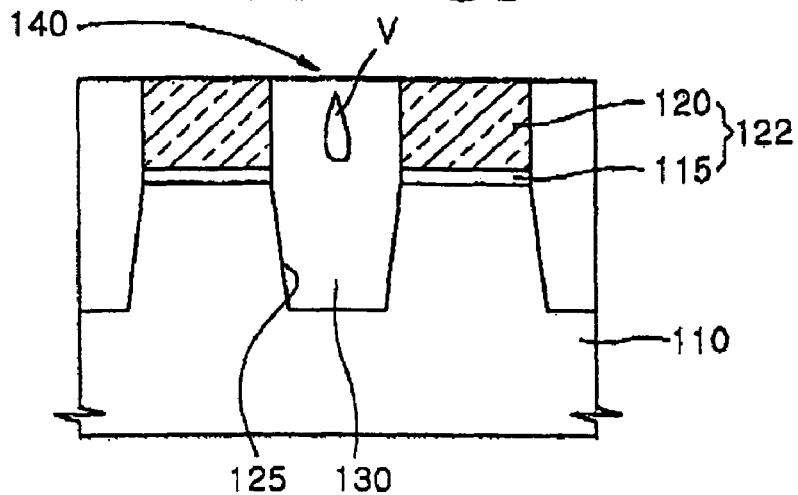
Figure 17:
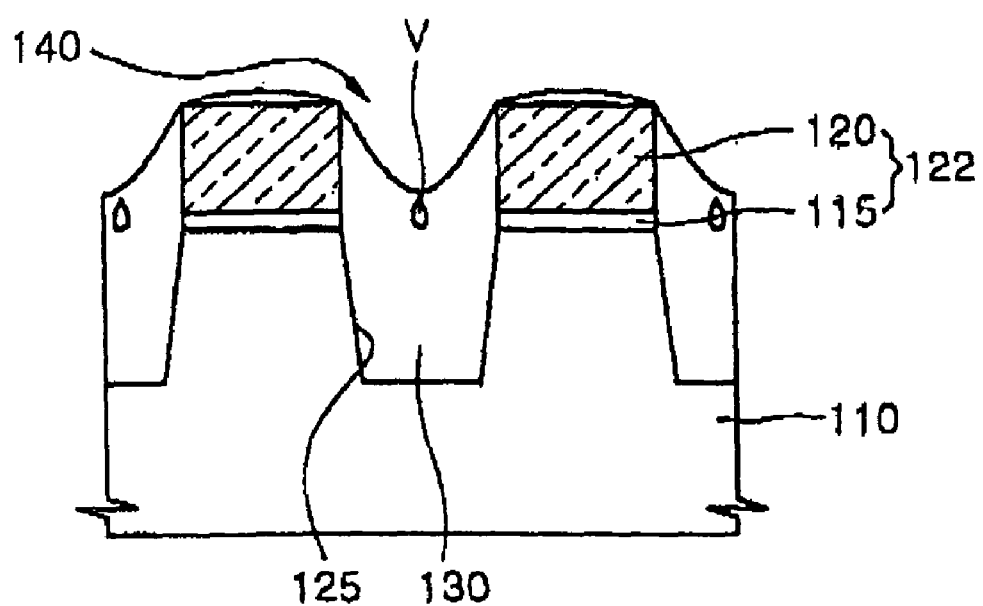

Referring to FIGS. 9 and 10, a first insulating layer 130 is deposited to fill insulating regions 140. Thereafter, first insulating layer 130 is planarized to expose mask patterns 122. However, the planarization of first insulating layer 130 may be omitted. A liner oxide layer or a liner nitride layer may be formed on inner surfaces of trenches 125 before filling trenches 125 with first insulating layer 130. The liner oxide or nitride layer cures defects generated during the etching process through which trenches 125 are formed, reinforces the adhesion of first insulating layer 130 and trenches 125, substantially prevents a leakage current, and substantially prevents a moat phenomenon that is apt to occur when a portion between an isolation layer and substrate 110 is dented during a subsequent etching process. First insulating layer 130 may be formed from at least one layer selected from the group consisting of a high density plasma (HDP) oxide layer, a plasma enhanced-tetraethylorthosilicate (PE-TEOS) layer, and a middle temperature oxide (MTO) layer comprising an undoped silicate glass (USG) oxide layer. First insulating layer 130 may be formed from a USG oxide layer, for example. Because of the increasing integration density of flash memory devices, a void V may be formed when narrow insulating regions 140 are filled with first insulating layer 130. In addition, although first insulating layer 130 is formed so that it completely fills insulating regions 140 in the illustrated embodiment of FIG. 10, first insulating layer 130 may be formed to partially fill insulating regions 140, as illustrated in FIG. 17.

Figure 11:
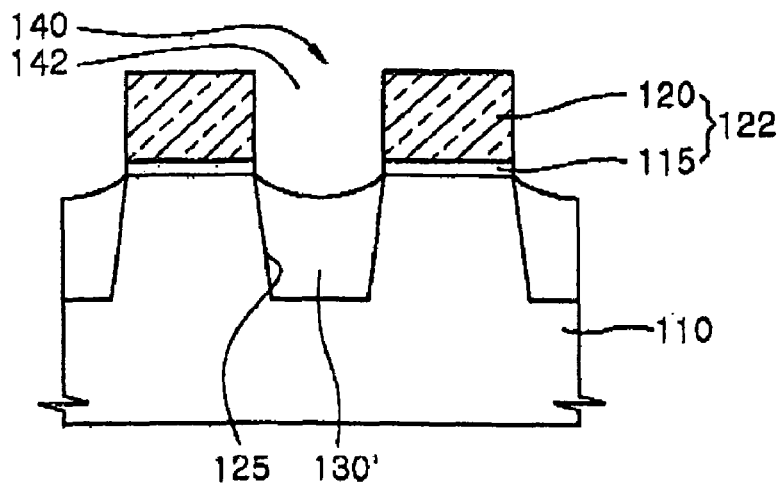

Referring to FIG. 11, first insulating layer 130 is etched (i.e., recessed) to form first insulating layer 130'. When first insulating layer 130 is formed such that first insulating layer 130 comprises void V, first insulating layer 130 may be etched until void V is removed. First insulating layer 130 may be etched such that the surface of first insulating layer 130' is flush with an upper surface of substrate 110 or higher than the upper surface of substrate 110 (e.g., by about 5-10 nm). When first insulating layer 130 is etched such that the surface of first insulating layer 130' is higher than the upper surface of substrate 110, it is possible to relieve the concentration of an electric field of a subsequently formed floating gate. Accordingly, lower portions of insulating regions 140 are filled with first insulating layer 130', and mask spaces 142 are formed between adjacent mask patterns 122 in upper portions of first insulating regions 140. The etching process may be performed through dry etching or wet etching.

Figure 12:
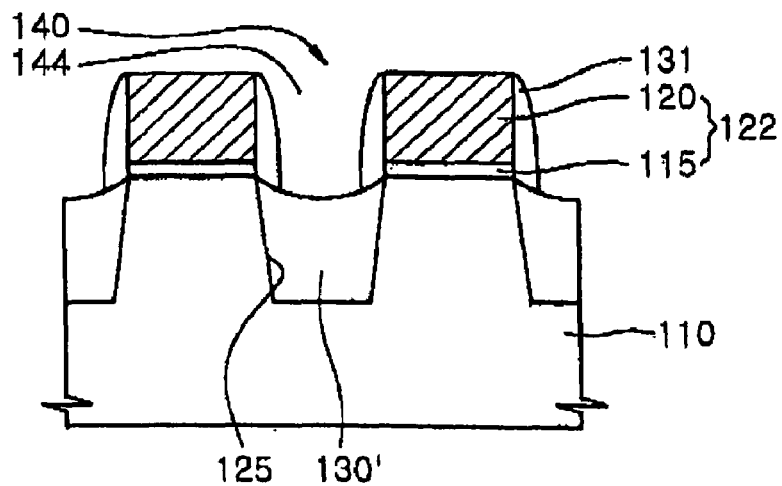

Referring to FIG. 12, a silicon nitride layer is formed on the resulting surface of substrate 110. Thereafter, an anisotropic dry etching process is performed on the silicon nitride layer to form spacers 131 on first insulating layer 130' and exposed sidewalls of mask patterns 122. Spacers 131 may be formed with a thickness (or width) of 1/10 to 1/3 of the distance between adjacent mask patterns 122 in accordance with the desired widths for floating gates that will be formed subsequently. For example, when the distance between adjacent mask patterns 122 is 60 nm, spacers 131 may each be formed with a width of 6 nm to 20 nm.

Figure 13:
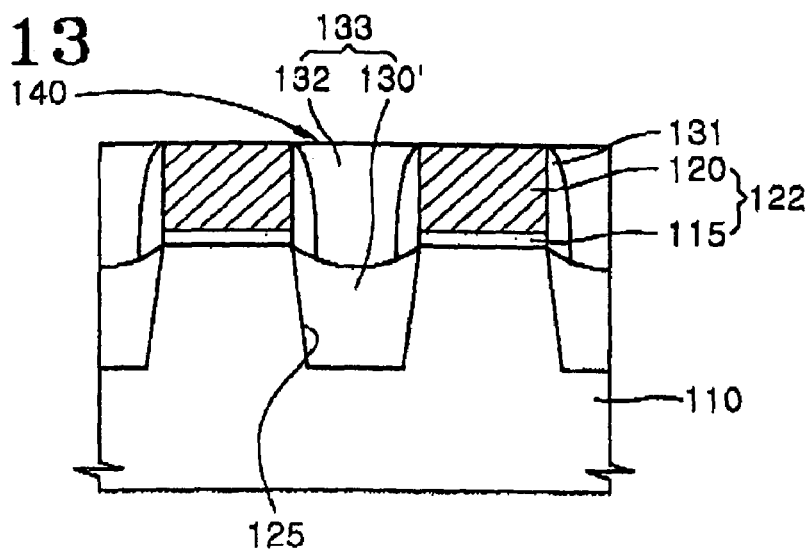

Referring to FIG. 13, a second insulating layer 132 is formed on first insulating layer 130' to fill the upper portions of insulating regions 140, that is, to fill upper insulating spaces 144. Upper insulating spaces 144 are the spaces between pairs of adjacent spacers 131. As used herein, a "pair" of adjacent spacers 131 is a pair of adjacent spacers 131 that is disposed between adjacent mask patterns 122. Thus, each upper insulating space 144 is disposed between adjacent mask patterns 122. Thereafter, second insulating layer 132 is planarized until mask patterns 122 are exposed, thereby forming isolation layers 133. Second insulating layer 132 may be any type of insulating layer. In the illustrated embodiment of FIG. 13, spacers 131 are formed on the sidewalls of mask patterns 122 and isolation layers 133 are formed from double insulating layers 130', 132, wherein double insulating layers 130', 132 comprise first insulating layers 130' and second insulating layers 132.

Figure 14:
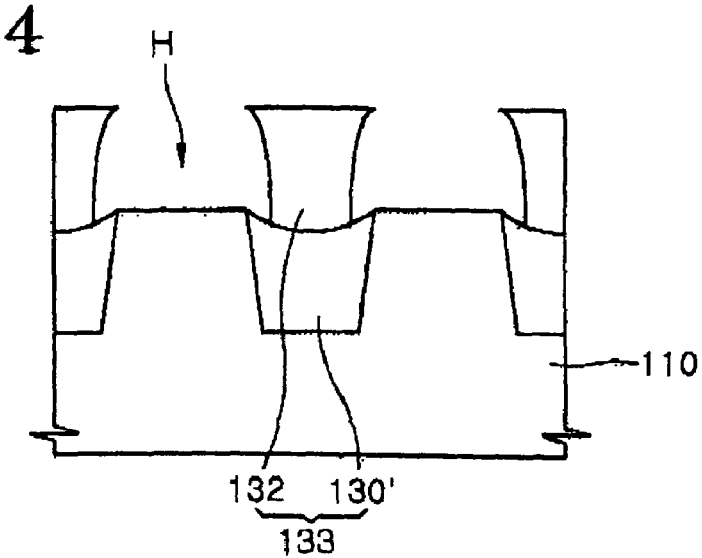

Referring to FIG. 14, mask patterns 122 and spacers 131 are removed such that upper portions of isolation layers 133 protrude from the surface of substrate 110. The process for removing mask patterns 122 and spacers 131 comprises first removing pad nitride layer 120 and spacers 131 through phosphoric acid ($H_3PO_4$) stripping, and then removing pad oxide layer 115 through wet etching. A wet etchant may be HF dilution or a buffer oxide etchant (BOE). The BOE may be a mixed solution of HF and $NH_4F$ mixed with a ratio of 100:1 or 300:1. Unlike in the conventional method described previously, when mask patterns 122 and spacers 131 are removed using the process described above with reference to mask patterns 122 and spacers 131, there is little possibility of a pit forming at an insulating layer (specifically, first insulating layer 130) of an isolation layer 133 because the phosphoric acid stripping process enables selective removal of pad nitride layers 120 and spacers 131 from pad oxide layer 115 and isolation layers 133, and wet etching only needs to be performed to remove pad oxide layer 115.

Referring to FIG. 14, a hole H, in which the floating gate will be formed in a subsequent process, is formed at an area from which a mask pattern 122 and spacers 131 were removed. Unlike in the conventional method described previously, in the illustrated embodiment of FIG. 14, the width of hole H is sufficient, so the width of hole H does not need to be expanded through wet etching. The width of hole H, and more specifically, the size of the floating gate that will be formed in hole H subsequently can be readily adjusted by adjusting the width of spacers 131 when spacers 131 are formed.

Figure 15:
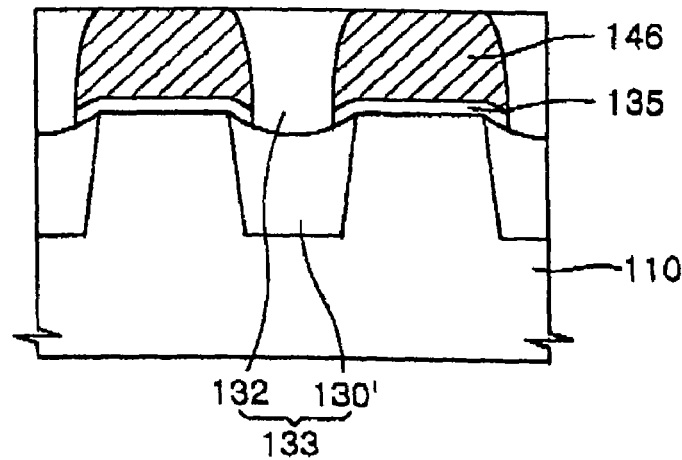

Referring to FIGS. 14 and 15, a tunnel oxide layer 135 is formed on substrate 110 between adjacent isolation layers 133 (i.e., in hole H). Thereafter, a conductive layer is deposited on tunnel oxide layer 135 to fill the remainder of hole H and is planarized to form a self-aligned floating gate 140 between adjacent isolation layers 133, wherein, after the planarization, the top surface of the conductive layer is flush with the top surfaces of the adjacent isolation layers 133 between which the conductive layer is formed. Tunnel oxide layer 135 is formed with a small thickness of 85-100 Å to enable electron tunneling. As an example, tunnel oxide layer 135 may be formed through wet oxidation at a temperature of 750-800° C. and is heat-treated using $N_2$ at a temperature of 900-910° C. for 20-30 minutes, thereby minimizing the density of defects formed between tunnel oxide layer 135 and substrate 110. The conductive layer deposited to form floating gate 140 may be a doped polysilicon layer. The doped polysilicon layer may be deposited on tunnel oxide layer 135 through LPCVD at a temperature of 500-700° C. The doped polysilicon layer may be formed using a process of depositing an undoped polysilicon layer on tunnel oxide layer 135 and then implanting arsenic (As) or phosphor (P) ions into the undoped polysilicon layer. Alternatively, the doped polysilicon layer may be formed by doping the polysilicon layer with impurities during the process of depositing the polysilicon layer using in-situ doping. The doping concentration may be greater than or equal to 1E21.

Figure 16:
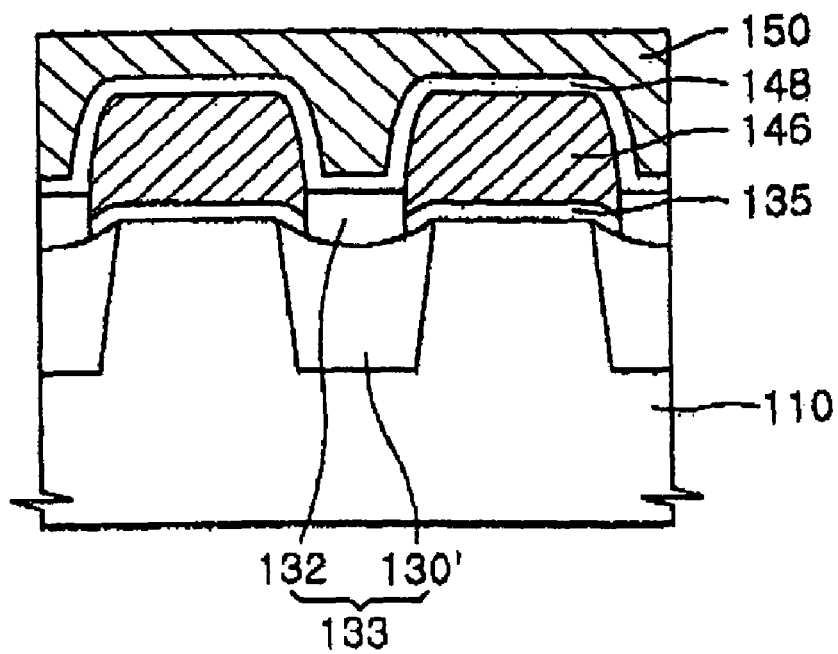

Referring to FIGS. 15 and 16, a wet etching process may be performed on isolation layers 133 to etch isolation layers 133 so that a top surface of floating gate 140 is higher than the top surfaces of isolation layers 133 relative to the surface working of substrate 110. The etchant used in the wet etching process may be HF dilution or a buffer oxide etchant (BOE). Thereafter, an inter-gate insulating layer 145 is formed on floating gate 140. Inter-gate insulating layer 145 may be an oxide/nitride/oxide (ONO) layer, a $Ta_2O_5$ layer, or a BST layer. Thereafter, inter-gate insulating layer 145 may be heat-treated to remove trapped charges, thereby improving a characteristic(s) of inter-gate insulating layer 145. Next, a control gate 150 is formed on inter-gate insulating layer 145. Control gate 150 may be formed from a doped polysilicon layer, a silicide layer, a doped polycide, or a metal layer. The silicide may be tungsten silicide, cobalt silicide, or titanium silicide.

As described above, the spacers are formed on the sidewalls of the mask pattern so that a subsequently formed hole, in which a floating gate will be formed, will be formed with a width that is greater than the width of a mask pattern without having to expand the width of the hole after it has been formed. Accordingly, unlike in a conventional method, using a method in accordance with an embodiment of the invention a hole having a width that is greater than the width of a mask pattern may be formed without performing a wet etching process to expand the hole. Consequently, the method in accordance with embodiments of the invention may substantially prevent a pit from being generated, which will substantially prevent damage to the oxide layer (i.e., the isolation layer) that would result from generation of a pit.

Also, the size of the floating gate can be readily adjusted by adjusting the width of the spacer. Accordingly, the CD of the floating gate in a device having a high integration density can be efficiently increased. Further, since the second insulating layer is formed after the first insulating layer is etched, the void generated in the first insulating layer can be removed. Also, the size of the floating gate increases in accordance with the removal of the void, thereby increasing the coupling ratio.

While the invention has been shown and described with reference to embodiments thereof, it will be understood by those of ordinary skill in the art that various changes in form and detail may be made to the embodiments without departing from the scope of the invention as defined by the accompanying claims.

What is claimed is:

1. A method of fabricating a flash memory device comprising:
    forming mask patterns on a substrate;
    etching the substrate using the mask patterns as an etch mask to form a plurality of trenches;
    filling the plurality of trenches with a first insulating layer, wherein sidewalls of the mask patterns remain substantially exposed after filling the plurality of trenches with the first insulating layer;
    forming a silicon nitride layer on the substrate;
    performing an anisotropic dry etching process on the silicon nitride layer to form spacers on the exposed sidewalls of the mask patterns;
    forming a second insulating layer on the first insulating layer to fill the plurality of trenches between the spacers to define isolation layers; and,
    removing the mask patterns and spacers.

2. The method of claim 1, wherein forming mask patterns on the substrate comprises:
    forming a pad oxide layer on the substrate;
    forming a pad nitride layer on the pad oxide layer; and,
    patterning the pad nitride layer and the pad oxide layer.

3. The method of claim 1, wherein each spacer has a thickness equal to about 1/10 through 1/3 of a distance between adjacent mask patterns.

4. The method of claim 3, wherein removing the mask patterns and the spacers comprises:
    removing the pad nitride layer and the spacers using a phosphoric acid solution; and,
    removing the pad oxide layer through wet etching.

5. The method of claim 1, wherein filling the trenches with a first insulating layer comprises:
    partially filling insulating regions with the first insulating layer; and,
    etching the first insulating layer.

6. The method of claim 1, wherein filling the trenches with a first insulating layer comprises:
    completely filling insulating regions with the first insulating layer; and,
    etching the first insulating layer.

7. The method of claim 6, wherein etching the first insulating layer comprises etching the first insulating layer until voids formed during the formation of the first insulating layer are removed.

8. The method of claim 1, wherein sidewalls of the mask patterns remain completely exposed after filling the trenches with the first insulating layer.

9. The method of claim 1, wherein the first insulating layer is formed from at least one layer selected from the group consisting of an HDP (high density plasma) oxide layer, a PE-TEOS (plasma enhanced-tetraethylorthosilicate) layer, and an MTO (middle temperature oxide) layer comprising an USG (undoped silicate glass) oxide layer.

10. The method of claim 1, further comprising:
    after removing the mask patterns and the spacers:
        forming a tunnel oxide layer on the substrate between adjacent isolation layers; and,
        forming a self-aligned floating gate on the tunnel oxide layer and between adjacent isolation layers.

11. The method of claim 10, wherein forming the self-aligned floating gate comprises:
    filling a hole between adjacent isolation layers with a doped polysilicon layer, wherein the doped polysilicon layer is formed on the substrate; and,
    planarizing the doped polysilicon layer, wherein the top surface of the doped polysilicon layer is flush with the top surface of at least one isolation layer after the planarizing of the doped polysilicon layer.

12. The method of claim 10, further comprising:
    performing a wet etchback process on the isolation layers after forming the self-aligned floating gate, wherein a top surface of the self-aligned floating gate is higher than top surfaces of the isolation layers, relative to the working surface of substrate, after performing the wet etching process.

13. The method of claim 12, further comprising:
    forming an inter-gate insulating layer on the self-aligned floating gate; and,
    forming a control gate on the inter-gate insulating layer.

14. The method of claim 13, wherein the inter-gate insulating layer comprises an oxide/nitride/oxide (ONO) layer, a $Ta_2O_5$ layer, or a BST layer.

15. The method of claim 13, wherein the control gate comprises a doped polysilicon layer, a silicide layer, a doped polycide, or a metal layer.

16. A method of fabricating a flash memory device comprising:
    forming mask patterns on a substrate;
    etching the substrate using the mask patterns as an etch mask to form a plurality of trenches;
    filling the plurality of trenches with a first insulating layer, wherein sidewalls of the mask patterns remain substantially exposed after filling the plurality of trenches with the first insulating layer;
    forming spacers on the exposed sidewalls of the mask patterns;
    forming a second insulating layer on the first insulating layer to fill the plurality of trenches between the spacers to define isolation layers;
    removing the mask patterns and spacers, and then forming a tunnel oxide layer on the substrate between adjacent isolation layers and forming a self-aligned floating gate on the tunnel oxide layer and between adjacent isolation layers.

17. The method of claim 16, wherein forming the self-aligned floating gate comprises:
    filling a hole between adjacent isolation layers with a doped polysilicon layer, wherein the doped polysilicon layer is formed on the substrate; and, planarizing the doped polysilicon layer, wherein the top surface of the doped polysilicon layer is flush with the top surface of at least one isolation layer after the planarizing of the doped polysilicon layer.

18. The method of claim 16, further comprising:

performing a wet etchback process on the isolation layers after forming the self-aligned floating gate, wherein a top surface of the self-aligned floating gate is higher than top surfaces of the isolation layers, relative to the working surface of substrate, after performing the wet etching process.

19. The method of claim 18, further comprising:

forming an inter-gate insulating layer on the self-aligned floating gate; and, forming a control gate on the inter-gate insulating layer.

* * * * *